United States Patent
Ausserlechner

(10) Patent No.: US 9,389,247 B2
(45) Date of Patent: Jul. 12, 2016

(54) CURRENT SENSORS

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 483 days.

(21) Appl. No.: 13/289,228

(22) Filed: Nov. 4, 2011

(65) Prior Publication Data

US 2013/0113477 A1    May 9, 2013

(51) Int. Cl.
*G01R 33/02* (2006.01)
*G01R 15/20* (2006.01)

(52) U.S. Cl.
CPC ..................... *G01R 15/207* (2013.01)

(58) Field of Classification Search
CPC ............... G01R 33/02; G01R 15/207
USPC .......... 324/117 R, 117 H, 126, 127, 144, 252, 324/260–263, 762.01; 257/421, 427
See application file for complete search history.

(56) References Cited

U.S. PATENT DOCUMENTS

| | | | |
|---|---|---|---|
| 5,406,202 A * | 4/1995 | Mehrgardt et al. | ........... 324/251 |
| 6,731,108 B2 | 5/2004 | Zalunardo | |
| 6,984,989 B2 * | 1/2006 | Kudo et al. | ........... 324/529 |
| 7,173,507 B2 | 2/2007 | Ries | |
| 7,646,192 B2 * | 1/2010 | Bjorn | ............... 324/96 |
| 2003/0184297 A1* | 10/2003 | Jakab | ............. G01R 33/285 324/318 |
| 2005/0140363 A1 | 6/2005 | Grimm | |
| 2006/0071655 A1* | 4/2006 | Shoji | ........... 324/117 H |
| 2007/0200564 A1* | 8/2007 | Motz et al. | ............... 324/247 |
| 2009/0001971 A1 | 1/2009 | Racz | |
| 2009/0177436 A1 | 7/2009 | Yoshida | |
| 2009/0251131 A1* | 10/2009 | Myers et al. | ............. 324/117 R |
| 2010/0097059 A1* | 4/2010 | Estrada | ............. G01R 33/0005 324/251 |
| 2010/0156394 A1* | 6/2010 | Ausserlechner et al. | ..... 324/144 |
| 2010/0244814 A1* | 9/2010 | Franklin | .................. 324/117 R |
| 2010/0295546 A1 | 11/2010 | Walther | |
| 2010/0301840 A1 | 12/2010 | Filatov | |
| 2010/0308816 A1* | 12/2010 | Ueda et al. | .................. 324/260 |
| 2011/0006763 A1* | 1/2011 | Bakker | ............... G01R 15/202 324/251 |
| 2012/0049849 A1 | 3/2012 | Balcom | |
| 2013/0027028 A1 | 1/2013 | Hohe | |
| 2013/0245992 A1 | 9/2013 | Servel | |

* cited by examiner

*Primary Examiner* — Arleen M Vazquez
*Assistant Examiner* — Brent J Andrews
(74) *Attorney, Agent, or Firm* — Eschweiler & Associates, LLC

(57) ABSTRACT

Embodiments relate to magnetic field current sensors having sensor elements for sensing at least two magnetic field components, for example Bx and By. The current in a conductor is estimated by Bx and Bx/By, wherein Bx is the primary measurement and Bx/By is a corrective term used to account for position tolerances between the sensor and the conductor. In other embodiments, the corrective term can be dBx/By, where dBx is a difference in between components sensed at different sensor elements. The particular field components can vary in embodiments; for example, the current can be estimated by By and By/Bx, or dBy/Bx or some other arrangement.

16 Claims, 3 Drawing Sheets

CURRENT SENSORS

TECHNICAL FIELD

The invention relates generally to current sensors and more particularly to compensating for positioning variances by calibration of magnetic field sensors.

BACKGROUND

Sensors that estimate the current flowing in a conductor by sensing the related magnetic field are known in the art. In as typical arrangement, the magnetic field sensor is fixedly positioned near the conductor such that it can sense the magnetic field related to current flowing in the conductor. To be accurate, the configuration of the conductor and the positional relationship between the conductor and the sensor must be known precisely. In practice, the latter is to challenge because small position errors result in large current measurement errors. Referring to FIG. 1, a sensor 100 having two magnetic field sensing elements 102, such as Hall plates, is depicted relative to a conductor 104. Sensing elements 102 are sensitive to magnetic fields in the y-direction, or By fields. Errors in a vertical or y-direction as depicted have a larger impact on sensor accuracy than those in a lateral or x-direction. Errors in the y-direction can be related to, for example, varying thickness of a mold compound, glue or bonding material between the sensor and the conductor.

Conventional techniques used to calibrate the sensor to account for positioning variances typically involve coupling the sensor and conductor, applying a known current to the conductor and measuring the current by the sensor. The values of the known current and measured current can then be used to determine a sensitivity of the sensor, which can be programmed into the sensor and taken into account going forward when currents are measured. It is challenging, however, to generate a stable known current for such a procedure.

Therefore, there is a need for improved current sensors.

SUMMARY

Embodiments relate to current sensors. In an embodiment, a current sensor for sensing current flow in a conductor comprises a semiconductor die; at least one magnetic field sensor element arranged on the semiconductor die and sensitive to a magnetic field in a first direction; and at least one magnetic field sensor element arranged on the semiconductor die and sensitive to a magnetic field in a second direction different from the first direction such that the current flow in the conductor can be estimated from the magnetic field in the second direction and the magnetic field in the first direction.

In an embodiment, a method comprises sensing a first magnetic field component of a magnetic field related to a current flow; sensing a second magnetic field component different from the first magnetic field component of a magnetic field related to the current flow; and estimating the current flow from the first magnetic field component and the second magnetic field component.

In an embodiment, a current sensing system comprises a conductor; a semiconductor die disposed proximate and spaced apart from the conductor; at least one magnetic field sensor element sensitive to a magnetic field in a first direction and coupled to the semiconductor die; at least one magnetic field sensor element sensitive to a magnetic field in a second direction different from the first direction and coupled to the semiconductor die; and circuitry coupled to the sensor elements and configured to estimate a current in the conductor from the magnetic field in the first direction sensed by at least one magnetic field sensor element sensitive to the magnetic field in the first direction and a ratio of the magnetic field in the first direction sensed by at least one magnetic field sensor element sensitive to the magnetic field in the first direction and the magnetic field in the second direction sensed by at least one magnetic field sensor element sensitive to the magnetic field in the second direction.

In an embodiment, a current sensor for sensing current flow in a conductor comprises a semiconductor die; at least one magnetic field sensor element arranged on the semiconductor die and sensitive to a magnetic field in a first direction; and at least one magnetic field sensor element arranged on the semiconductor die and sensitive to a magnetic field in a second direction different from the first direction such that a distance between the magnetic field sensor elements and the conductor can be estimated from the magnetic field in the second direction and the magnetic field in the first direction.

In an embodiment, a current sensor comprises a first sensor system configured to detect a magnetic field in a first direction; a second sensor system configured to detect a magnetic field gradient in a second direction different from the first direction; and a conductor configured to conduct current and produce a magnetic field related to the current that has a flat plateau for the first magnetic field direction and the magnetic field gradient in the second direction with respect to at least one position tolerance related to the first and second sensor systems.

BRIEF DESCRIPTION OF THE DRAWINGS

The invention may be more completely understood in consideration of the following detailed description of various embodiments of the invention in connection with the accompanying drawings, in which.

Figure 1:
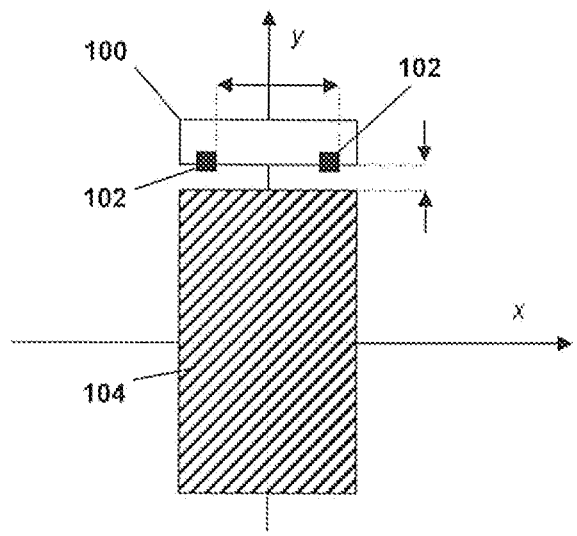
FIG. 1 is a cross-sectional block diagram of a sensor and conductor according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to magnetic field current sensors comprising sensor elements for sensing at least two magnetic field components, for example Bx and By. The current in a conductor is estimated by Bx and Bx/By, wherein Bx is the primary measurement and Bx/By is a corrective term used to account for position tolerances between the sensor and the conductor. In other embodiments, the corrective term can be dBx/By, where dBx is a difference in between components sensed at different sensor elements. The particular field components can vary in embodiments; for example, the current can be estimated by By and By/Bx, or dBy/Bx or some other arrangement, with the particular axes discussed herein corresponding to the drawings and being used for convenience without limitation.

Figure 2:
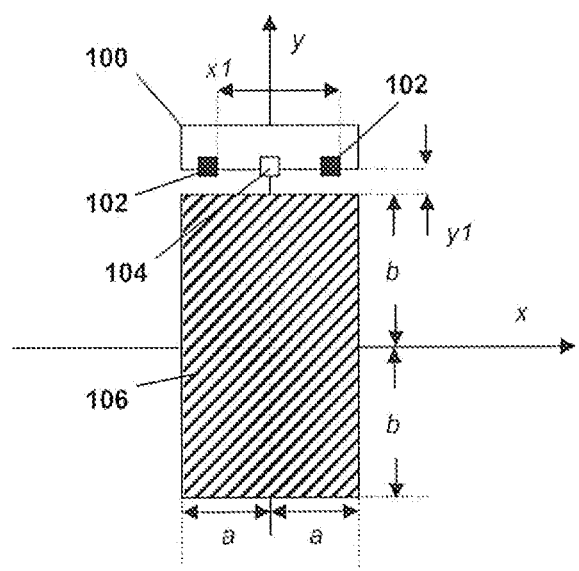
FIG. 2 is a cross-sectional block diagram of a sensor and conductor according to an embodiment.

Referring to FIG. 2, a magnetic field sensor 100 comprises three sensing elements: two elements 102 sensitive to a first component of the magnetic field and one element 104 sensitive to a second component of the magnetic field, mounted on a sensor die. As depicted in FIG. 2, elements 102 are sensitive to the By component, and element 104 is sensitive to the Bx component, though these can vary in other embodiments and are used herein for the purposes of illustration and convenience without limitation. The number of sensor elements can also vary in embodiments and can be more or fewer than the three depicted in FIG. 2. In embodiments, sensor elements 102 can be the same or a different type of magnetic field sensor than sensor element 104. For example, sensor elements 102 can be Hall devices while sensor element 104 is magnetoresistive or a vertical Hall device. Other types and combinations are also possible.

Sensor 100 is disposed proximate a current conductor 106. Conductor 106 can comprise a bus bar, current rail or some other current carrier and can have other shapes, sizes and configurations in other embodiments. In the example embodiment depicted and discussed herein, conductor 106 has a width in the x-direction of 2a=3.44 mm and a length in the y-direction of 2b=5.81 mm. Conductor 106, in one embodiment, is non-magnetic, with a relative permeability close to 1, and there are no magnetic materials near sensor elements 102, 104.

Figure 3:
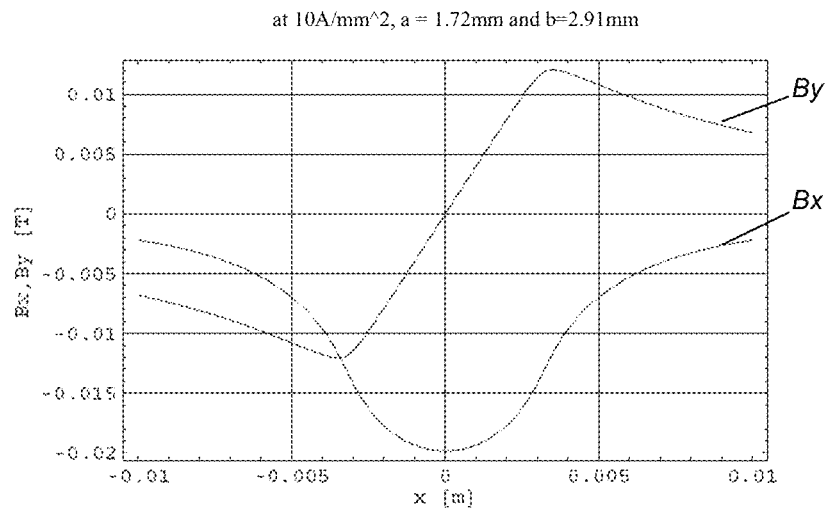
FIG. 3 is a plot of Bx and By fields at various distances according to an embodiment.

With sensor elements 102, 104 so positioned in embodiments, the advantages of the symmetry can be utilized. The By-field is an odd function, By(-x)=-By(x), while the Bx-field is an even function: Bx(-x)=Bx(x). Referring also to FIG. 3, Bx thus has a plateau near the origin, while By has a linear slope near x=0 and thus dBy=By(+1.5 mm)-By(-1.5 mm) changes very little, if the sensor die is shifted in the x-direction (as shown in FIG. 4).

Figure 4:
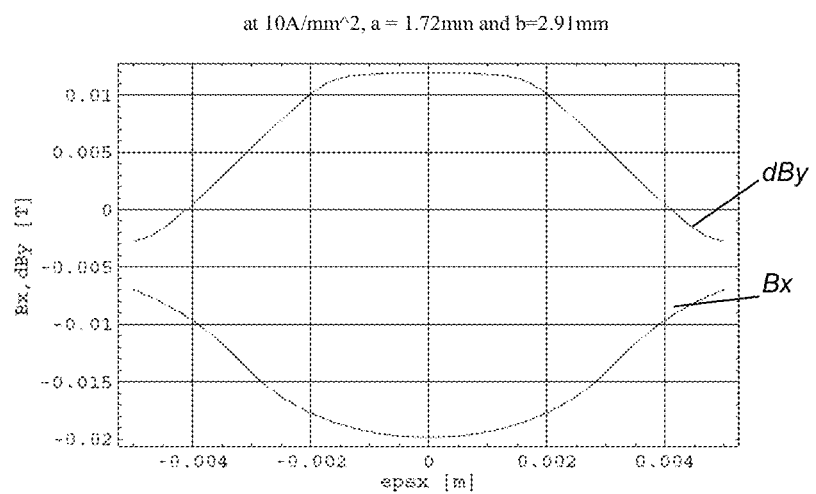
FIG. 4 is a plot of Bx and dBy versus epsilon x according to an embodiment.
Figure 5:
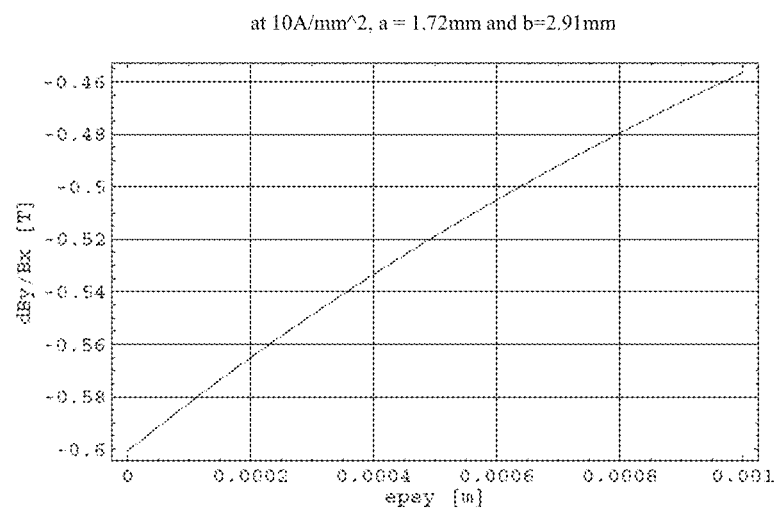
FIG. 5 is a plot of dBy/Bx versus epsilon y according to an embodiment.

Referring to FIG. 4, the dBy signal is constant around x=0 given the linear slope of By versus x. Therefore, lateral (i.e., x-direction as depicted) positioning errors have little or no effect on dBy and Bx. The ratio of Bx/dBy is thus a pure, or nearly so, function of vertical (i.e., y-direction as depicted) position, as depicted in FIG. 5.

In an embodiment, then, conductor 106 conducts current and produces a magnetic field related to the current that has a flat plateau for the x- and y-directions with respect to at least one position tolerance related to the sensor elements 102, 104.

In embodiments, dBy is the difference in magnetic By-fields at two locations that are x1=3 mm apart (as depicted in FIG. 2): dBy=By(x=epsx+1.5 mm)-By(x=epsx-1.5 mm), where epsx is the distance between x=0 and the center point between sensor elements 102. The particular dimensions used in examples herein are merely exemplary and can vary in other embodiments. Ideally, epsx=0, but due to assembly and other tolerances epsx can be +/-0.1 mm-0.5 mm in embodiments, though this range can also vary. Bx is measured at x=epsx, the center between elements 102 in FIG. 2. Hence, element 104 is positioned midway between the two, also as depicted in FIG. 2.

In embodiments, sensor 100 and conductor 106 are assembled such that all sensing elements 102, 104 are equally spaced in the y-direction relative to conductor 106, for example y1=0.3 mm as depicted in FIG. 2. In such an embodiment, dBy/Bx would be expected to be -0.55. If dBy/Bx is measured to be -0.54, it corresponds to a vertical (y-direction) distance of 0.35 mm. In other words, a y-position error of only 0.05 mm changes the ratio of dBy/Bx by about 2%.

Sensor 100 estimates the current in embodiments according to the following:

$$I_{estimated} = S_y db_y \left(1 + \delta\left(\frac{B_x}{dB_y}\right)\right)$$

where Sy is a sensitivity in the y direction and $$-1 \ll \delta \frac{B_x}{dB_y} \ll 1$$

is a small correction term related to the ratio $$\frac{B_x}{dB_y}.$$

Instead of $dB_y$, By of one of sensor elements 102 can be used in embodiments, but in general $dB_y$ is less prone to background magnetic disturbances. To avoid magnetic disturbances, $dB_x=B_x$(first location)-$B_x$(second location) can be used. A linear approximation $$\delta\left(\frac{B_x}{dB_y}\right) = S_{xy} \frac{B_x}{dB_y}$$

can also be used.

The magnetic sensitivities of each of sensor elements 102, 104 can also vary, while in embodiments it is advantageous for these elements 102, 104 to be as similar as possible. In one embodiment, the ratio of magnetic sensitivities can be kept determined more accurately by using an on-chip calibration wire that generates magnetic Bx and By fields on sensor elements 102, 104. The ratio of Bx and By fields depends upon the geometry of the wire and elements 102, 104, but it can be constant throughout production because the geometry can be accurate in embodiments up to at least 1 μm.

Thus, this calibration wire can be used prior to the calibration discussed herein above to compare the signals, referred to as Bx(Ical) and By(Ical), respectively, from the Bx and By fields in response to a current through the wire. In essence, the wire can be used to calibrate the ratio of sensitivities of the sensor elements 102, 104. Next, a current can be passed through conductor 106, and the Bx and By fields measured again as Bx(Iprimary) and By(Iprimary). Sensor 100 can then use the ratio of [Bx(Iprimary)/By(Iprimary)]/[Bx(Ical)/By(Ical)] in order to determine the y-distance between sensor elements 102, 104 and conductor 106, with this distance then used in the calibration. In another embodiment, Bx/sqrt(Bx^2+By^2) can be used instead of Bx/By.

During operation, sensor element 104 can be prone to magnetic disturbances. Thus, in embodiments sensor 100 can use sensors elements 102 to obtain a first estimate of the current in conductor 106. Then sensor 100 can add the fields from each of sensor elements 102: in theory, if the sensor die is symmetrical to conductor 106, this sum is independent of the current. In practice, some asymmetry is almost always present, however, and the sum is a mix of the external fields and the fields generated by conductor 106. Because sensor 100 already has an approximation of the current, it can use this to get a better estimation of the disturbance fields. Once sensor 100 knows the disturbance fields, it can take high fields into account or provide an error signal or flag in certain situations in which the fields exceed some threshold. In the opposite case, in which the disturbance fields are low, sensor 100 can have greater certainty with respect to the Bx reading and compute the Bx/dBy ratio in order to check if the distance between sensor 100 and conductor 106 is within an acceptable range. If the ratio varies from a target value by some amount, sensor 100 can provide a signal or other indication regarding the relative positioning of sensor 100 and conductor 106 in embodiments.

The function Bx/dBy versus y-distance can also depend on the frequency of the current, e.g., due to eddy currents, and therefore Bx, dBy and/or Bx/dBy can be low-pass filtered in embodiments to estimate the y-distance.

Also, in embodiments, a look-up table can be used instead of or in addition to the ratio(s) discussed above. For example, the Bx value can specify a column and the By value the line of the table to provide a corrective term delta to account for position tolerances or directly provide the y-position.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A current sensor for sensing current flow in a conductor comprising:
    a semiconductor die;
    at least one magnetic field sensor element arranged on the semiconductor die and sensitive to a first magnetic field component of a magnetic field induced by the current flow in the conductor;
    at least two magnetic field sensor elements arranged on the semiconductor die and sensitive to a second magnetic field component of the magnetic field induced by the current flow in the conductor, the second magnetic field component being perpendicular to the first magnetic field component; and
    circuitry coupled to the at least one magnetic field sensor elements sensitive to the first and second magnetic field components respectively, and configured to determine the current flow in the conductor from the first magnetic field component and the second magnetic field component;
    wherein the at least one magnetic field sensor element sensitive to the first magnetic field component is disposed between the two magnetic field sensor elements sensitive to the second magnetic field component;
    wherein the circuitry is further configured to determine the current flow in the conductor from a difference in the second magnetic field component at the two magnetic field sensor elements sensitive to the second magnetic field component and a ratio of the difference to the first magnetic field component at the at least one first magnetic field sensor element sensitive to the first magnetic field component, wherein the first magnetic field component and the second magnetic field component is induced by the current flow in the conductor.

2. The current sensor of claim 1, wherein the circuitry is configured to determine the current flow in the conductor from the second magnetic field component and a ratio of the second magnetic field component to the first magnetic field component.

3. The current sensor of claim 2, wherein the ratio is a calibration term to account for position tolerances between the current sensor and the conductor.

4. The current sensor of claim 1, wherein a symmetry center of the magnetic field sensor elements nominally corresponds with a symmetry center of the conductor.

5. The current sensor of claim 1, wherein the second magnetic field component is in a direction in which the magnetic field sensor elements are spaced apart from the conductor and the first magnetic field component is in a further direction in which the magnetic field sensor elements are spaced apart from one another.

6. A method comprising:
    sensing, via a current sensor with at least one sensor element sensitive to a first magnetic field component, the first magnetic field component of a magnetic field related to a current flow in a conductor;
    sensing, via the current sensor with at least two sensor elements sensitive to a second magnetic field component, the second magnetic field component of the magnetic field related to the current flow, the second magnetic field component being perpendicular to the first magnetic field component;
    determining the current flow from the first magnetic field component and the second magnetic field component;
    determining a difference in magnetic field components sensed at the at least two sensor elements sensitive to the second magnetic field component;
    determining a ratio of the difference to the first magnetic field component; and
    estimating the current flow from the second magnetic field component and the ratio of the difference to the first magnetic field component.

7. The method of claim 6, further comprising arranging the sensor elements on a semiconductor die of the current sensor.

8. The method of claim 7, further comprising arranging the current sensor relative to the conductor.

9. The method of claim 8, wherein the ratio accounts for position tolerances between the current sensor and the conductor.

10. The method of claim 9, further comprising providing a signal when a position tolerance limit is exceeded.

11. The method of claim 6, further comprising:
installing the current sensor and the conductor; and
determining the ratio.

12. The method of claim 11, further comprising periodically re-determining the ratio.

13. A current sensing system comprising:
a conductor;
a semiconductor die disposed proximate and spaced apart from the conductor;
at least one first magnetic field sensor element sensitive to a first magnetic field component of a magnetic field related to a current in the conductor and coupled to the semiconductor die;
at least one second magnetic field sensor element sensitive to a second magnetic field component perpendicular to the first magnetic field component of the magnetic field related to the current in the conductor and coupled to the semiconductor die; and
circuitry coupled to the sensor elements and configured to determine the current in the conductor from the first magnetic field component sensed by the at least one first magnetic field sensor element and a ratio of the first magnetic field component sensed by the at least one first magnetic field sensor element to the second magnetic field component sensed by the at least one second magnetic field sensor element;
wherein the first magnetic field component used in the ratio comprises a difference in magnetic field components sensed at first and second ones of the at least one first magnetic field sensor element sensitive to the first magnetic field component.

14. The current sensing system of claim 13, wherein the ratio calibrates the current sensing system according to relative positions of the magnetic field sensor elements and the conductor.

15. A current sensor for sensing current flow in a conductor comprising:
a semiconductor die;
at least one magnetic field sensor element arranged on the semiconductor die and sensitive to a first magnetic field component of a magnetic field induced by the current flow in the conductor;
at least one magnetic field sensor element arranged on the semiconductor die and sensitive to a second magnetic field component perpendicular to the first magnetic field component of the magnetic field; and
circuitry coupled to the at least one magnetic field sensor elements sensitive to the first and second magnetic field components respectively, configured to determine a ratio of the first magnetic field component to the second magnetic field component, and determine a distance between the at least one magnetic field sensor elements sensitive to the first and second magnetic field components and the conductor from the ratio;
a calibration wire configured to utilize the distance or the ratio to calibrate the current sensor according to relative positions of the at least one magnetic field sensor elements sensitive to the first and second magnetic field components, respectively, and the conductor.

16. A current sensor comprising:
a conductor configured to conduct current inducing a magnetic field related to the current;
a first sensor system configured to detect a first magnetic field component of the magnetic field; and
a second sensor system comprising at least two sensor elements configured to detect a second magnetic field component of the magnetic field, the second magnetic field component being perpendicular to the first magnetic field component; and
circuitry configured to determine a difference in magnetic field components sensed at the at least two sensor elements, respectively, determine a ratio of the difference to the first magnetic field component, and estimate the current from the second magnetic field component and the ratio of the difference to the first magnetic field component.

* * * * *